(12) United States Patent
Morita et al.

(10) Patent No.: US 7,119,437 B2
(45) Date of Patent: Oct. 10, 2006

(54) ELECTRONIC SUBSTRATE, POWER MODULE AND MOTOR DRIVER

(75) Inventors: Koji Morita, Iwata (JP); Takao Yoshikawa, Iwata (JP); Takayuki Murai, Iwata (JP)

(73) Assignee: Yamaha Hatsudoki Kabushiki Kaisha, Shizuoka-Ken (JP)

( * ) Notice: Subject to any disclaimer, the term of this patent is extended or adjusted under 35 U.S.C. 154(b) by 90 days.

(21) Appl. No.: 10/737,122

(22) Filed: Dec. 17, 2003

(65) Prior Publication Data

US 2005/0087849 A1 Apr. 28, 2005

(30) Foreign Application Priority Data

Dec. 26, 2002 (JP) ............................. 2002-378553
Dec. 26, 2002 (JP) ............................. 2002-378579

(51) Int. Cl.
*H01L 23/34* (2006.01)

(52) U.S. Cl. ........................................ 257/724; 257/691
(58) Field of Classification Search ................ 257/723, 257/724, 691, 758, 700
See application file for complete search history.

(56) References Cited

U.S. PATENT DOCUMENTS

| | | | | |
|---|---|---|---|---|
| 5,291,065 A | * | 3/1994 | Arai et al. | 257/723 |
| 5,504,372 A | * | 4/1996 | Braden et al. | 257/723 |
| 5,721,455 A | * | 2/1998 | Takashita | 257/713 |
| 5,966,291 A | * | 10/1999 | Baumel et al. | 361/707 |
| 6,175,084 B1 | | 1/2001 | Saitoh et al. | |
| 6,262,477 B1 | | 7/2001 | Mahulikar et al. | |
| 6,373,705 B1 | | 4/2002 | Koelle et al. | |
| 6,841,866 B1 | * | 1/2005 | Arai et al. | 257/702 |
| 6,885,097 B1 | * | 4/2005 | Maeno et al. | 257/698 |
| 2002/0074651 A1 | | 6/2002 | Morita et al. | |
| 2002/0140290 A1 | | 10/2002 | Goto et al. | |
| 2003/0063442 A1 | | 4/2003 | Kimoto et al. | |

FOREIGN PATENT DOCUMENTS

| | | |
|---|---|---|
| EP | 0 938 138 | 8/1999 |
| EP | 1 104 024 | 5/2001 |
| EP | 1 160 866 | 12/2001 |
| JP | 09-139580 | 5/1997 |
| JP | 09/285008 | 10/1997 |
| JP | 10/242344 | 9/1998 |
| JP | 10-242385 | 9/1998 |
| JP | 2002-127741 | 5/2002 |
| JP | 2002-184791 | 6/2002 |
| JP | 2002-184907 | 6/2002 |
| JP | 2002-262593 | 9/2002 |

OTHER PUBLICATIONS

"Reduction of Circuit Inductance in Motor Controllers for Electric Vehicles", Small Engine Technology Conference & Exhibition, Sep. 2003, Marriott Madison West, Madison, Wisconsin, USA.

* cited by examiner

Primary Examiner—S. V. Clark

(57) ABSTRACT

An electronic substrate is used to mount a plurality of semiconductor chips thereon. The substrate includes a first conductive member, a second conductive member, and an insulating layer. The first conductive member is electrically connected to one of the semiconductor chips. The second conductive member is electrically connected to another one of the semiconductor chips. The insulating layer is arranged to electrically isolate the second conductive member from the first conductive member. The first conductive member is a conductive base that supports the insulating layer, the semiconductor chips and the second conductive member thereon.

15 Claims, 11 Drawing Sheets

ELECTRONIC SUBSTRATE, POWER MODULE AND MOTOR DRIVER

BACKGROUND OF THE INVENTION

1. Field of the Invention

The present invention relates to an electronic substrate to effectively mount power semiconductor chips thereon and also relates to a power module in which power semiconductor chips are mounted on such an electronic substrate. The present invention further relates to a motor driver and an electric vehicle including such a power module.

2. Description of the Related Art

Some devices with a semiconductor component (which is sometimes generally called a "semiconductor device") include a substrate, on which an interconnection pattern is defined, and the semiconductor component mounted as a chip (i.e., a semiconductor chip) on that substrate. Such a substrate on which no semiconductor chips have been mounted yet will be referred to herein as an "electronic substrate". In a device obtained by mounting power semiconductor chips on such an electronic substrate (which will be referred to herein as a "power module" or a "power semiconductor assembly"), a large amount of current of, for example, 50 amperes or more, normally flows through its interconnection pattern. For that reason, the interconnection pattern of such a power module is thicker than that of a normal electronic substrate and may have a thickness of 300 μm, for example.

A power module (or power semiconductor assembly), which includes an electronic substrate and power semiconductor chips mounted thereon and which is used to supply current to a motor, for example, is disclosed in Japanese Laid-Open Publication No. 2002-184907. Hereinafter, the configuration of the power module disclosed in Japanese Laid-Open Publication No. 2002-184907 will be described with reference to FIG. 1.

The power module 100 shown in FIG. 1 includes a metal base substrate 103 and semiconductor chips 105 mounted on the metal base substrate 103. The metal base substrate 103 includes a metallic base plate 101 and an insulating layer 102 provided thereon as a coating.

Pads 104 are provided on the insulating layer 102 of the metal base substrate 103 and the power semiconductor chips 105 are bonded onto those pads 104. Specifically, the semiconductor chips 105 are directly soldered to the pads 104 (where solder is identified by the reference numeral 106 in FIG. 1). Also, the semiconductor chips 105 are connected to a copper foil pattern 107 on the metal base substrate 103 by way of bonding wires 108.

Such a power module 100 may be used to supply current to a three-phase AC motor, for example. FIG. 2 shows an equivalent circuit of a three-phase AC motor driver.

In this motor driver, terminals a and b are connected to a battery and a smoothing capacitor. In the example shown in FIG. 2, a positive potential is applied to the terminal a and a negative potential is applied to the terminal b. Three current paths, each including a pair of power field effect transistor devices (which will be referred to herein as "FET devices") that are connected in series together, are defined between the terminals a and b. That is to say, a circuit is made up of these six FET devices and the respective gate electrodes of the FET devices are connected in common to a gate driver. The gate driver controls the operations of the FET devices, thereby supplying three-phase AC current to a motor through terminals c, d and e.

In the motor driver shown in FIG. 2, the circuit section inside of the dashed-line box is implemented as the power module (or power semiconductor assembly). Among the components shown in FIG. 2, at least the power module (or power semiconductor assembly) and the gate driver can be integrated together on the same substrate. Thus, an apparatus including a power module and a gate driver with such a configuration will be referred to herein as a "motor driver".

If the electronic substrate shown in FIG. 1 is used, such a motor driver may be implemented as shown in FIGS. 3A, 3B and 3C. Specifically, FIG. 3A shows a planar layout for a motor driver implemented with the semiconductor device shown in FIG. 1, FIG. 3B is a cross-sectional view thereof, and FIG. 3C shows the encircled portion of FIG. 3B on a larger scale.

As can be seen from FIG. 3B, this motor driver includes a power module having the same configuration as that shown in FIG. 1 and a gate driver for controlling the operations of the FET devices is further provided on its substrate. The respective circuit components are connected together by way of the copper foil pattern provided on the insulating layer and aluminum wires.

The electrodes a, b, c, d and e shown in FIG. 3A respectively correspond to the terminals a, b, c, d and e shown in FIG. 2. Also, in FIG. 3A, the electrodes a and b function as a positive power supply line and a negative power supply line, respectively.

Next, the electronic substrate disclosed in Japanese Laid-Open Publication No. 9-139580 will be described with reference to FIG. 4.

As shown in FIG. 4, the electronic substrate 109 disclosed in Japanese Laid-Open Publication No. 9-139580 has a two-layer interconnect structure. The electronic substrate 109 includes a metal base 110, a first insulating layer 111 provided on the metal base 110, a lower interconnect 112 provided on the first insulating layer 111, a second insulating layer 111' arranged so as to cover the lower interconnect 112, and an upper interconnect 112' provided on the second insulating layer 111'. Both of these interconnects 112 and 1121 are made of a copper foil pattern.

In the motor driver shown in FIGS. 3A, 3B and 3C, the electrodes and interconnects thereof have parasitic inductance L. Accordingly, while the FET devices are switching, an overvoltage, which is proportional to the product of a current variation ratio di/dt and the inductance L, is generated. The magnitude of this overvoltage is proportional to the current variation ratio di/dt. Thus, the higher the switching rate of the FET devices, the greater the overvoltage and the more likely the FET devices get damaged.

To protect the FET devices from such damage, either the inductance L or the current variation ratio di/dt needs to be decreased. However, if the current variation ratio di/dt was decreased, then the switching time and the switching loss both would increase and the high-speed switching performance should deteriorate. For that reason, the parasitic inductance L should be reduced.

Thus, in a conventional power module, the parasitic inductance L is reduced by opposing a pair of conductors such that currents flow through the conductors in mutually opposite directions and such that the magnetic fluxes produced by these currents cancel each other. In this case, the opposite currents preferably have approximately the same magnitude. The parasitic inductance L can be reduced even more effectively as the distance between the two opposed conductors is shortened and as their opposing area is broadened.

In the layout shown in FIG. 3A, the direction of current flowing through the electrode a is also opposite to that of current flowing through the electrode b, and the two electrodes a and b are located sufficiently close to each other. However, it is difficult to further reduce the distance between the electrodes a and b or the parasitic inductance L produced because the distance and the inductance L have already been reduced close to their lowest processible limits. In addition, since the electrodes a and b extend substantially parallel to the surface of the substrate, long bonding wires are needed to connect the respective FET devices to the copper foil pattern. As a result, the inductance produced by the bonding wires themselves increases and the overall parasitic inductance also increases unintentionally.

For that reason, instead of trying to further reduce the parasitic inductance, FET devices, specially designed to withstand such a high overvoltage, should be used. Alternatively, additional components need to be provided on the substrate for the purpose of overvoltage protection. As a result, the cost of the power module increases significantly.

Also, even if the multilayer structure shown in FIG. 4 is used to avoid these problems, the following new problems arise.

Specifically, if a power FET device is operated on the upper interconnect 112', then the FET device will generate a considerable quantity of heat and its temperature will exceed 100° C. In that case, this heat needs to be dissipated away by way of the base. However, the two insulating layers 111 and 111' provided between the FET device and the base obstruct the smooth heat flow. Thus, the FET device cannot be cooled down sufficiently and may exhibit deteriorated performance or be damaged. Furthermore, if the amounts of currents flowing through the lower and upper interconnects 112 and 112' are large, then the interconnects 112 and 112' also generate non-negligible quantities of heat. The lower interconnect 112, in particular, is sandwiched between the first and second insulating layers 111 and 111', and the heat generated from the lower interconnect 112 cannot be dissipated away so easily.

As can be seen, if such a multilevel interconnect structure is provided on the base, then the insulating layers will obstruct the heat dissipation to a significant degree. Furthermore, the electronic substrate having a two-layer interconnect structure such as that shown in FIG. 4 requires an overly complicated manufacturing process and an excessively high manufacturing cost.

SUMMARY OF THE INVENTION

In order to overcome the problems described above, preferred embodiments of the present invention provide an electronic substrate that achieves low parasitic inductance and high heat dissipation efficiency at the same time, and also provide a power module including such an electronic substrate and a motor driver including such a power module.

An electronic substrate according to a preferred embodiment of the present invention is preferably used to mount a plurality of semiconductor chips thereon. The substrate preferably includes a first conductive member, a second conductive member, and an insulating layer. The first conductive member is preferably electrically connected to one of the semiconductor chips. The second conductive member is preferably electrically connected to another one of the semiconductor chips. The insulating layer is preferably arranged to electrically isolate the second conductive member from the first conductive member. The first conductive member is preferably a conductive base that supports the insulating layer, the semiconductor chips and the second conductive member thereon.

In one preferred embodiment of the present invention, the insulating layer is preferably provided on the conductive base, a patterned conductive film is preferably defined on the insulating layer, and a portion of the patterned conductive film preferably functions as the second conductive member.

In this particular preferred embodiment, the electronic substrate preferably further includes a first power supply electrode and a second power supply electrode. The first power supply electrode is preferably electrically connected to the conductive base, while the second power supply electrode is preferably electrically connected to the second conductive member. While the semiconductor chips are ON, the first and second power supply electrodes are preferably connected to an external power supply.

Specifically, the first power supply electrode is preferably provided on the insulating layer and is preferably electrically connected to the conductive base by way of an opening which is arranged so as to extend through the insulating layer.

More specifically, the conductive base is preferably provided with a plurality of recesses. A first conductive pin is preferably inserted into one of the recesses of the conductive base so as to electrically connect the conductive base to the first power supply electrode. A second conductive pin is preferably inserted into another one of the recesses of the conductive base so as to electrically connect the conductive base to another portion of the patterned conductive film.

In this specific preferred embodiment, the direction of a current flowing through an inside portion of the conductive base between the first and second conductive pins is preferably substantially opposite to that of a current flowing through an inside portion of the second conductive member. In this case, the inside portion of the second conductive member preferably overlaps with that of the conductive base.

In still another preferred embodiment, the conductive base is preferably a metal plate with a thickness of at least approximately 1 mm, and preferably has a flat back surface that is able to make a thermal contact with a heat sink.

In yet another preferred embodiment, the second conductive member and the first and second power supply electrodes are preferably formed by patterning metal foil.

In yet another preferred embodiment, while the semiconductor chips are ON, a current flowing between the first and second power supply electrodes preferably has a maximum value of at least approximately 50 amperes. The maximum value of the current may also exceed approximately 100 amperes.

In yet another preferred embodiment, the insulating layer is preferably made of an epoxy resin with a thickness of about 0.2 mm or less.

A power module according to a preferred embodiment of the present invention preferably includes a plurality of power semiconductor chips, a first conductive member, a second conductive member and an insulating layer. The first conductive member is preferably electrically connected to one of the power semiconductor chips. The second conductive member is preferably electrically connected to another one of the power semiconductor chips. The insulating layer is preferably arranged to electrically isolate the second conductive member from the first conductive member. The first conductive member is preferably a conductive base that supports the insulating layer, the power semiconductor chips and the second conductive member thereon.

A motor driver according to a preferred embodiment of the present invention preferably includes a power module, which is connected to a DC power supply so as to generate an alternating current, and a controller for controlling the power module. The power module preferably includes at least four power semiconductor chips, a first conductive member, a second conductive member, an insulating layer, and a plurality of output terminals. The first conductive member is preferably electrically connected to a first group of semiconductor chips including one half of the at least four power semiconductor chips. The second conductive member is preferably electrically connected to a second group of semiconductor chips including the other half of the at least four power semiconductor chips. The insulating layer is preferably arranged to electrically isolate the first conductive member from the second conductive member. The output terminals are preferably arranged to electrically connect each of the semiconductor chips of the first group to an associated one of the semiconductor chips of the second group. The first conductive member is preferably a conductive base that supports the insulating layer, the semiconductor chips and the second conductive member thereon. While a direct current is supplied between the first and second conductive members, the controller preferably controls operations of the power semiconductor chips, thereby supplying the output terminals with an AC voltage.

An electric vehicle according to another preferred embodiment of the present invention preferably includes the motor driver of the various preferred embodiments of the present invention described above, a battery for supplying power to the motor driver, a traveling motor to be driven by the motor driver, and wheels to be driven by the motor.

A method of making an electronic substrate according to another preferred embodiment of the present invention is a method of making an electronic substrate on which semiconductor chips are mounted. The method preferably includes the steps of preparing a conductive base, the surface of which is covered with an insulating layer at least partially, and forming a patterned conductive film on the insulating layer such that the patterned conductive film includes portions to be electrically connected to the conductive base and portions to be electrically isolated from the conductive base.

A power module fabricating method according to another preferred embodiment of the present invention preferably includes the steps of preparing the electronic substrate of any of the preferred embodiments of the present invention described above and mounting power semiconductor chips as bare chips on the electronic substrate.

An electronic substrate according to another preferred embodiment of the present invention is preferably used to mount a plurality of semiconductor chips thereon. The substrate preferably includes a first conductive member, a second conductive member, an insulating layer, and a conductive base. The first conductive member is preferably electrically connected to one of the semiconductor chips. The second conductive member is preferably electrically connected to another one of the semiconductor chips. The insulating layer is preferably arranged to electrically isolate the second conductive member from the first conductive member. The conductive base preferably supports the first and second conductive members, the insulating layer and the semiconductor chips thereon. The second conductive member is preferably a conductive plate, which is large enough to mount at least one of the semiconductor chips thereon. The conductive plate is preferably supported on the conductive base so as to cover at least a portion of the first conductive member.

In one preferred embodiment of the present invention, the direction of a current flowing through the conductive plate is preferably substantially opposite to that of a current flowing through the portion of the first conductive member under the conductive plate.

In another preferred embodiment, the insulating layer is preferably a silicone sheet, a polyimide film, an epoxy resin and/or an air layer. Other suitable insulating layers may also be used.

In various preferred embodiments of the present invention described above, the first and second conductive members vertically overlap with each other so as to define a sort of two-layer interconnect structure. Thus, the bonding wires can be shortened and a layout contributing to reduction in unwanted parasitic inductance can be easily obtained. In addition, one of the first and second conductive members is not a patterned conductive film but a conductive base or plate. Thus, such a conductive member achieves high heat-dissipating effects and can be produced easily.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, power modules according to preferred embodiments of the present invention will be described with reference to the accompanying drawings.

Preferred Embodiment 1

Figure 5A:
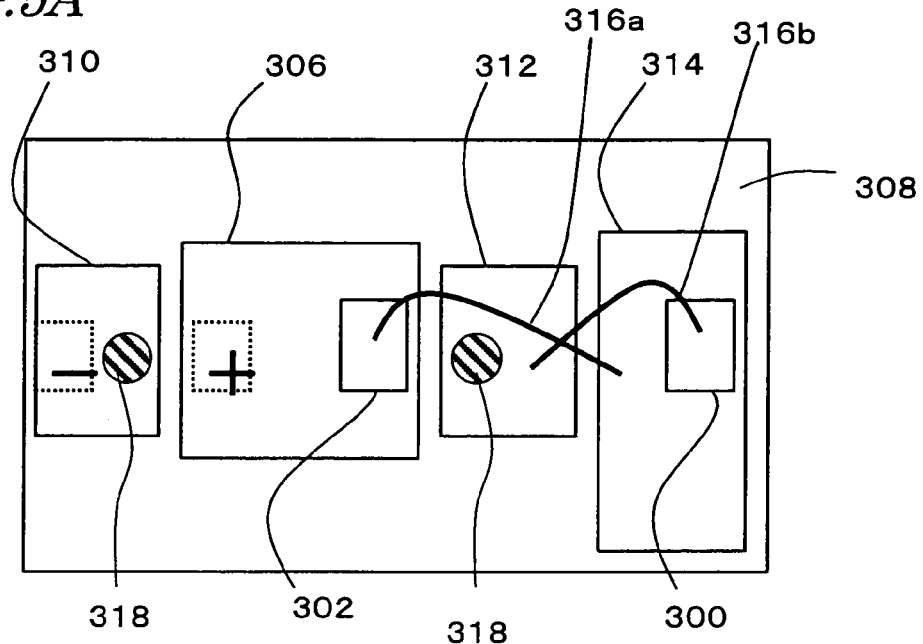
FIGS. 5A, 5B and 5C are respectively a plan view, a cross-sectional view and an equivalent circuit diagram of a power module according to a first specific preferred embodiment of the present invention.
Figure 5B:
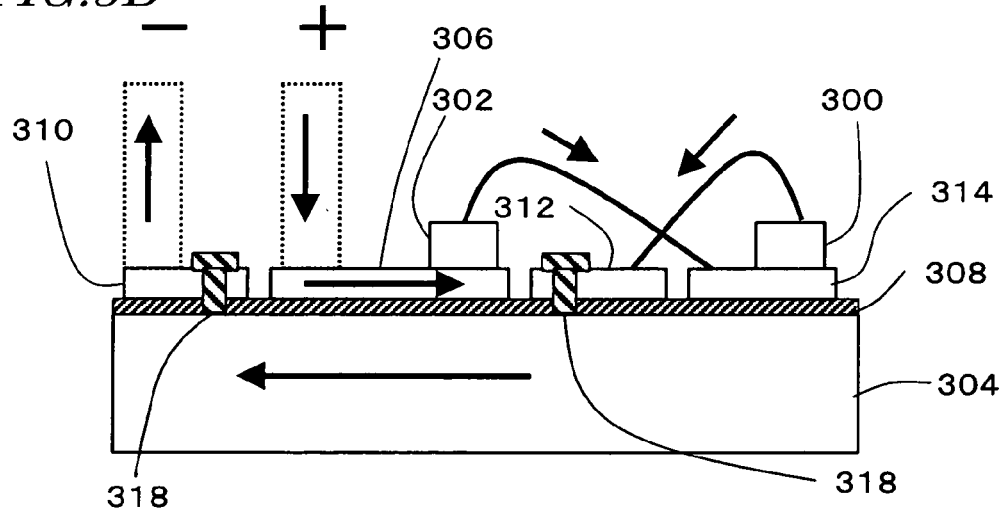
Figure 5C:
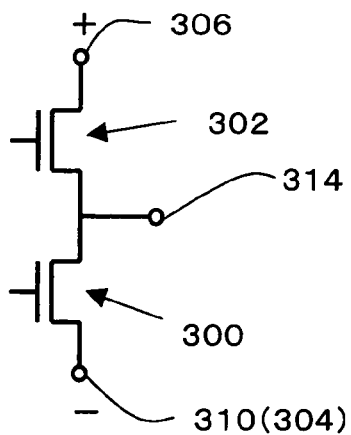

A configuration for a power module according to a first specific preferred embodiment of the present invention will be described with reference to FIGS. 5A through 5C. FIGS. 5A and 5B are respectively a plan view and a cross-sectional view of a power module according to the first preferred embodiment. FIG. 5C shows an equivalent circuit of the power module of the first preferred embodiment.

The power module of the first preferred embodiment preferably includes a novel electronic substrate and two power FET devices 300 and 302, which are mounted on the electronic substrate. Although two power FET devices 300 and 302 are preferably included in this preferred embodiment, the number of power FET devices can be changed as desired. This electronic substrate preferably includes a first conductive member (conductive base) 304 which is electrically connected to one FET device 300, a second conductive member 306 which is electrically connected to the other FET device 302, and an insulating layer 308 for electrically isolating the second conductive member 306 from the first conductive member 304.

More specifically, the first conductive member 304 is preferably a plate with a flat upper surface and a flat lower surface, and the insulating layer 308 is preferably provided on that flat upper surface of the first conductive member 304. As shown in FIG. 5A, not only the second conductive member 306 but also a power supply electrode 310, a semiconductor chip electrode 312 and an output electrode 314 are preferably provided on the insulating layer 308. Each of the second conductive member 306, power supply electrode 310, semiconductor chip electrode 312 and output electrode 314 that are provided on the insulating layer 308 is preferably made of a patterned conductive film (e.g., a copper foil pattern).

As shown in FIG. 5B, each of the power supply electrode 310 and semiconductor chip electrode 312 is preferably electrically connected to the first conductive member 304 by way of a connector 318 of solder, for example. Also, the semiconductor chip electrode 312 is preferably electrically connected to the FET device 300 on the output electrode 314 by way of a bonding wire 316b. On the other hand, the FET device 302 on the second conductive member 306 is preferably electrically connected to the output electrode 314 by way of another bonding wire 316a.

FIG. 5C shows an equivalent circuit of the power module having such a configuration. As can be seen from FIG. 5C, the two FET devices 300 and 302 are connected in series between the first and second conductive members 304 and 306. By turning ON these two FET devices 300 and 302 at appropriate timings, a large amount of current can flow from the second conductive member 306 to the first conductive member 304.

Figure 1:
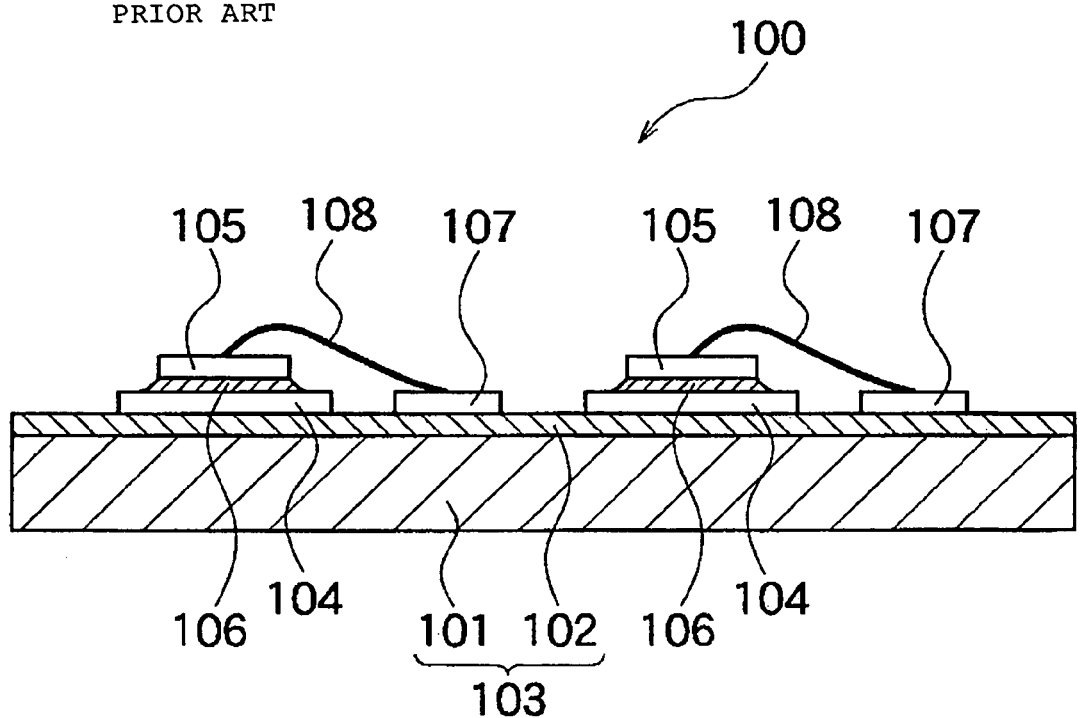
FIG. 1 is a cross-sectional view of a conventional power module.
Figure 2:
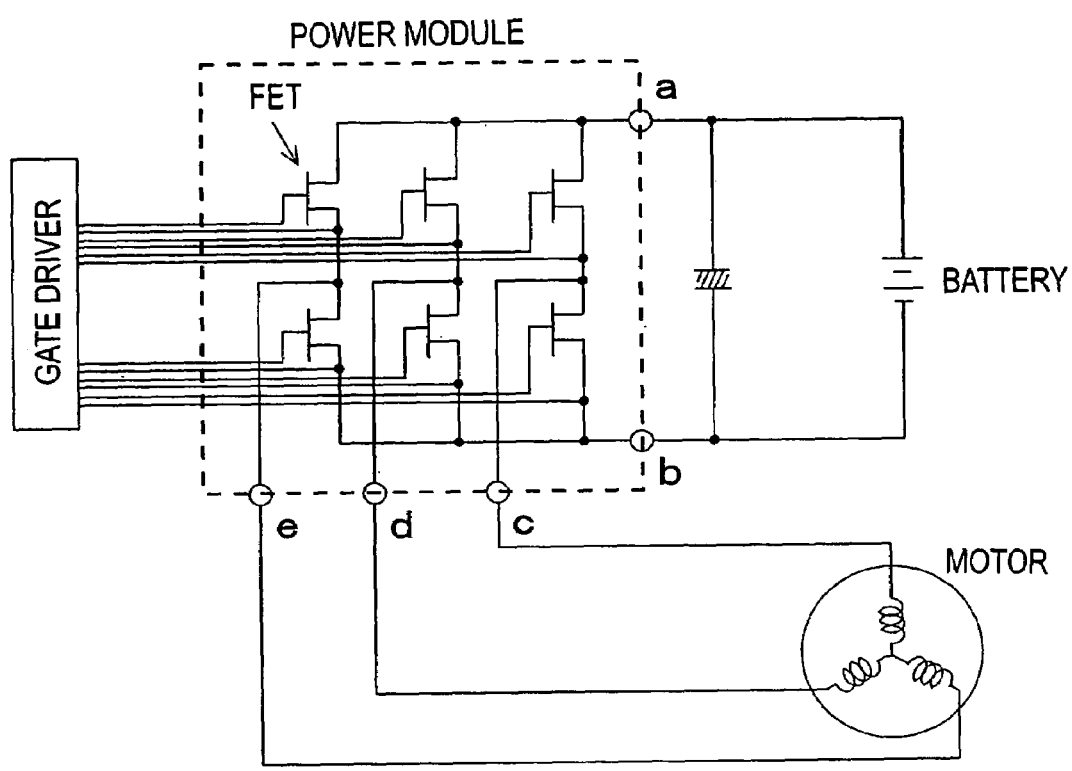
FIG. 2 is an equivalent circuit diagram of a driver for a three-phase motor.

The two FET devices 300 and 302 of this equivalent circuit correspond to the pair of serially connected transistors shown in FIG. 2. By driving the voltage to be applied to the respective gates of these two FET devices 300 and 302, the voltage to be generated in the output electrode 314 can be increased or decreased significantly.

In the example illustrated in FIGS. 5A, 5B and 5C, the first conductive member 304 is supplied with a negative (−) potential and the second conductive member 306 is supplied with a positive (+) potential. However, the potential levels at the first and second conductive members 304 and 306 only need to be defined such that the potential level of the first conductive member 304 is lower than that of the second conductive member 306. Thus, that relationship is also satisfied even if the first and second conductive members 304 and 306 are not supplied with negative and positive potentials, respectively. For example, the first conductive member 304 may be supplied with a ground potential. Optionally, the potentials at the first and second conductive members 304 and 306 may also be positive and negative, respectively, as opposed to the example illustrated in FIGS. 5A, 5B and 5C. In that case, the current will also flow in the direction opposite to the illustrated one.

It should be noted that the first and second conductive members may sometimes be referred to herein as a "first current supplying portion" and a "second current supplying portion", respectively.

In the example illustrated in FIGS. 5A, 5B and 5C, the first conductive member 304 functioning as the first current supplying portion is supplied with a potential by way of the negative terminal of an external battery, which is connected to the power supply electrode (i.e., first power supply electrode) 310 on the insulating layer 308. On the other hand, the second conductive member 306 functioning as the second current supplying portion is supplied with a potential by way of the positive terminal of the external battery, which is connected to the second conductive member 306. Accordingly, in the example illustrated in FIGS. 5A, 5B and 5C, a portion of the second conductive member 306 may be regarded as functioning as a positive power supply electrode (i.e., second power supply electrode). Alternatively, the second power supply electrode and the second conductive member 306 may also be separate circuit components (or conductive patterns). The important point is that the second power supply electrode should be electrically connected to the second conductive member in any case.

Also, in the example illustrated in FIGS. 5A, 5B and 5C, the battery is preferably electrically connected to the first conductive member 304 by way of the first power supply electrode 310 and connector 318 that are provided on the insulating layer 308. However, the present invention is in no way limited to this specific preferred embodiment. For example, the battery and the first conductive member 304 may also be electrically connected together by way of a portion of the end surface or back surface of the conductive base as the first conductive member 304.

In the arrangement described above, current flows in the directions indicated by the bold arrows in FIG. 5B. As can be seen from FIG. 5B, the direction of the current flowing through an inside portion of the first conductive member 304 between the two connectors 318 is opposite to that of the current flowing through an inside portion of the second conductive member 306 over the inside portion of the first conductive member 304. By making large amounts of currents flow in mutually opposite directions in this manner, the parasitic capacitance can be reduced significantly. Also, since the first conductive member 304 is not present on the insulating layer 308 on the substrate, the electrodes can be arranged on the insulating layer 308 with much greater design freedom and flexibility and the bonding wires can be shortened. Thus, the parasitic capacitance can be reduced for this reason also.

It should be noted that the upper and lower surfaces of the conductive base functioning as the first conductive member 304 are preferably flat as shown in FIG. 5B. Alternatively, these surfaces may have some unevenness that is intentionally provided. However, if the upper surface of the conductive base is flat, the patterned conductive film can be easily defined on the conductive base. Also, if the lower surface of the conductive base is flat, then the conductive base can make a thermal contact with a heat sink much more easily.

Figure 6A:
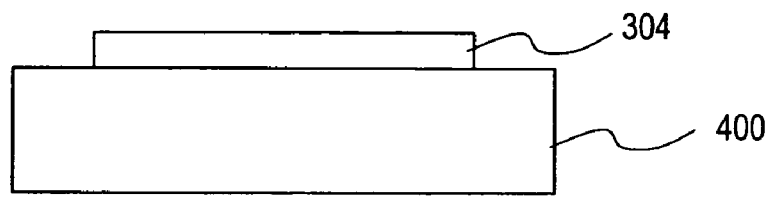
FIGS. 6A, 6B, 6C and 6D show exemplary arrangements each including a heat sink 400 and a first conductive member (metal base) 304.

The power module of this preferred embodiment is used to supply a large amount of current. Accordingly, the power module needs to dissipate generated Joule heat efficiently so as to minimize the unwanted increase in the temperature of the power module. For that purpose, this power module is preferably used such that the lower surface of the first conductive member 304 can make a thermal contact with the heat sink 400 as shown in FIG. 6A. If the first conductive member 304 needs to be electrically isolated from the heat sink 400, then a thin insulator (e.g., a silicone sheet) may be interposed between the upper surface of the heat sink 400 and the lower surface of the first conductive member 304. The material and thickness of this insulator are defined so as to further accelerate the heat flow from the first conductive member 304 into the heat sink.

Figure 6B:
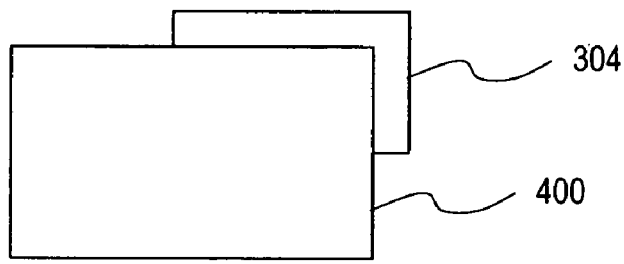
Figure 6C:
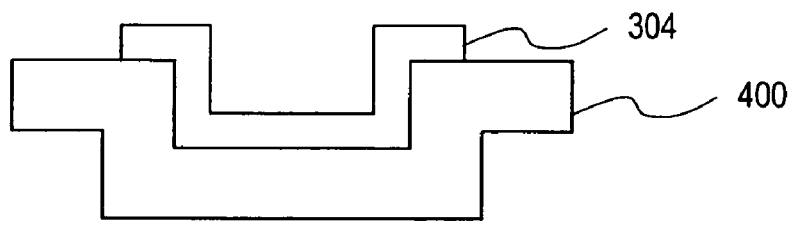
Figure 6D:
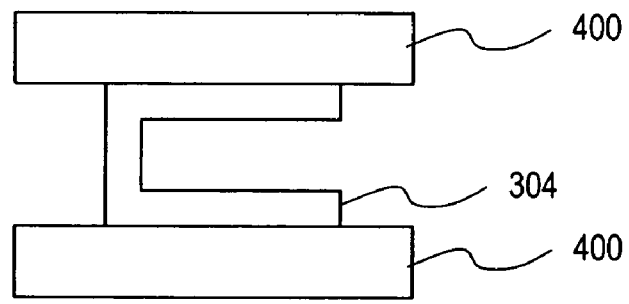

The first conductive member 304 may be obtained by processing a metal or any other suitable electrically conductive material into a plate shape. However, the first conductive member 304 does not have to be completely flat but may have any of various other shapes as shown in FIGS. 6B, 6C and 6D.

In the power module of the preferred embodiment described above, when a large amount of current flows through the patterned conductive film and FET devices, a considerable quantity of heat is generated. However, the heat can be quickly dissipated into the first conductive member 304 by way of the thin insulating layer 308. The upper surface of the first conductive member 304 has a sufficiently wide area and the conductive base is preferably made of a metal material with a high thermal conductivity. Consequently, the considerable quantity of heat that has been generated by the large amount of current can be efficiently dissipated away (typically into the heat sink).

Furthermore, the first conductive member 304 preferably has no patterned shape but behaves as a bulk conductor. Thus, the first conductive member 304 has sufficiently low electrical resistance and the quantity of heat generated from the first conductive member 304 being supplied with the current can also be minimized.

In this manner, the first conductive member 304 can not only allow a large amount of current to flow therethrough but also functions as a good heat conductor for the heat sink. Thus, according to this preferred embodiment, the quantity of heat generated from the power module can be reduced significantly and the small quantity of heat generated can also be dissipated highly efficiently.

Figure 7A:
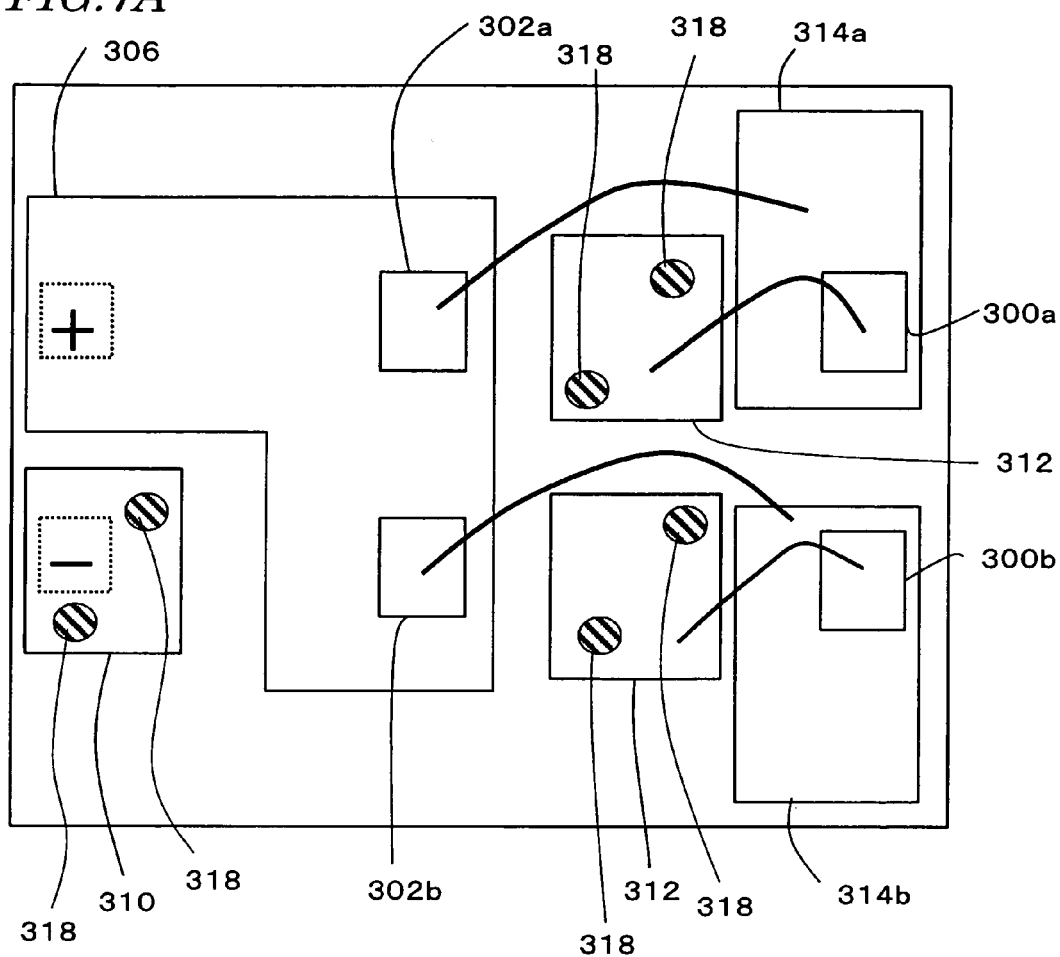
FIGS. 7A and 7B are respectively a plan view and an equivalent circuit diagram showing a modified example of the power module shown in FIGS. 5A through 5C.
Figure 7B:
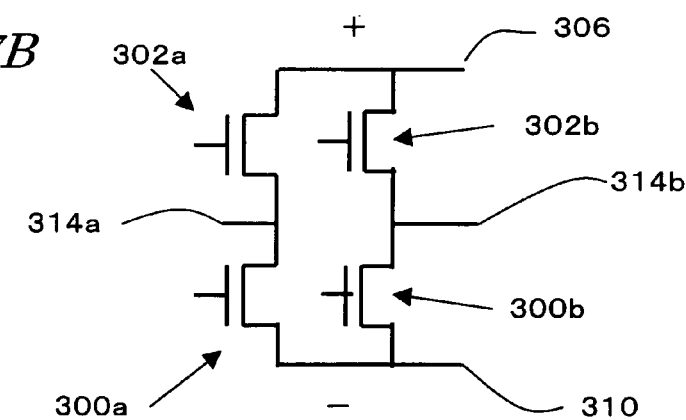

The power module illustrated in FIGS. 5A and 5B preferably includes just two semiconductor chips for the sake of simplicity. However, when this power module is used to drive a motor, at least four semiconductor chips are preferably mounted on the electronic substrate. FIG. 7A shows a planar layout for a power module including four semiconductor chips and FIG. 7B shows an equivalent circuit thereof. In this layout, two pairs of FET devices 300a, 302a and 300b, 302b are mounted on the substrate. Accordingly, a two-phase alternating current can be extracted from output electrodes 314a and 314b.

In the preferred embodiment described above, the connectors 318, which electrically connect the electrodes on the insulating layer 308 to the metal base functioning as the first conductive member 304, are preferably made of solder. Alternatively, these connectors 318 may also be made of any other conductive material.

Preferred Embodiment 2

Figure 8A:
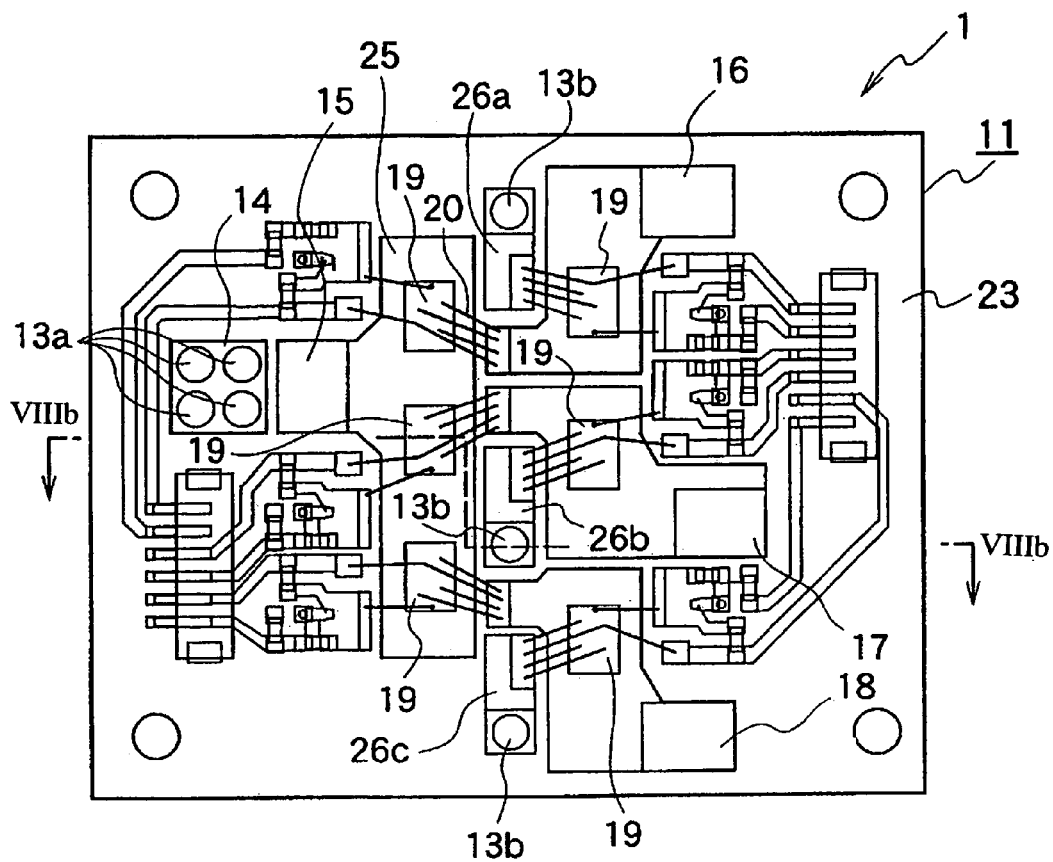
FIG. 8A is a plan view of a motor driver according to a second specific preferred embodiment of the present invention.
Figure 8B:
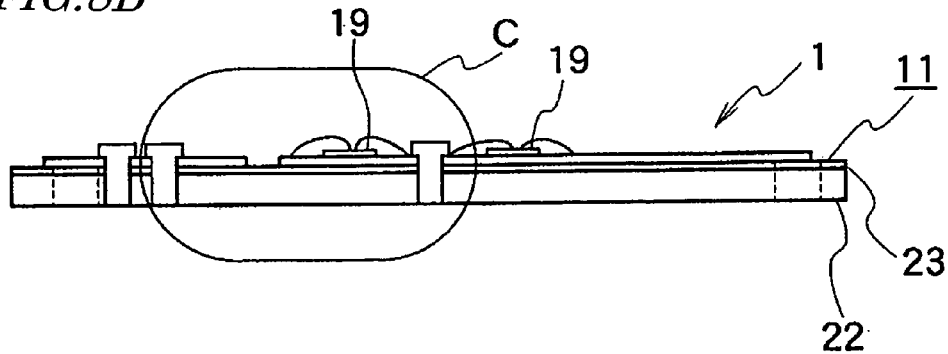
FIG. 8B is a cross-sectional view of FIG. 8A as taken along the lines VIIIb—VIIIb shown in FIG. 8A.
Figure 8C:
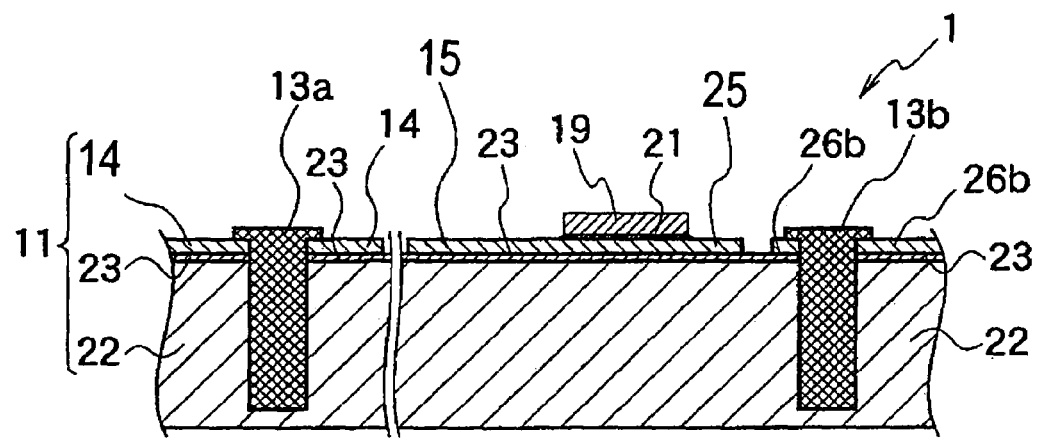
FIG. 8C shows the encircled portion C of FIG. 8B on a larger scale.
Figure 8D:
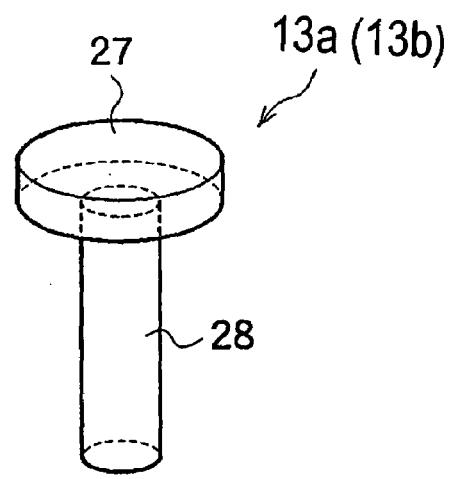
FIG. 8D is a perspective view of a connector pin 13*a* or 13*b*.

Hereinafter, a motor driver according to a second specific preferred embodiment of the present invention will be described with reference to FIGS. 8A, 8B, 8C and 8D. FIG. 8A is a plan view of a motor driver according to the second preferred embodiment. FIG. 8B is a cross-sectional view thereof as taken along the lines VIIIb—VIIIb shown in FIG. 8A. FIG. 8C shows the encircled portion C of FIG. 8B on a larger scale. And FIG. 8D is a perspective view of an electrically conductive connector pin.

As shown in FIG. 8C, the motor driver 1 of this preferred embodiment preferably includes an electronic substrate (metal base substrate) 11 and six FET devices 19 that are mounted on the electronic substrate 11.

The electronic substrate 11 preferably includes a metal base (metal plate) 22 having a thickness of, for example, about 2 mm to about 3 mm, an insulating layer 23 provided on the metal base 22, and a plurality of conductive elements (e.g., copper foil pattern elements) provided on the insulating layer 23. The electronic substrate 11 preferably has a substantially rectangular or substantially square planar shape with a length of, for example, about 30 mm to about 150 mm each side. The conductive elements (e.g., copper foil pattern elements) preferably have a thickness of, for example, about 105 μm to about 500 μm and preferably function as a power supply electrode 14, a second conductive member 25 and semiconductor chip electrodes 26a, 26b and 26c.

The metal base 22 is preferably a plate-shaped base made of an electrically conductive material with good thermal conductivity (e.g., aluminum or copper or other suitable material) and preferably has a thickness of, for example, at least about 1 mm, more preferably about 2 mm to about 3 mm. The metal base 22 functions as a first conductive member according to a preferred embodiment of the present invention.

The insulating layer 23 provided on the upper surface of the metal base 22 is preferably made of a material with good electrically insulating property and good heat dissipation property. In this preferred embodiment, the insulating layer 23 is preferably made of an epoxy resin with a thickness of about 0.2 mm or less (specifically, about 0.05 mm to about 0.2 mm).

As shown in FIG. 8C, multiple tiny recesses are preferably provided on the upper surface of the metal base 22 so as to receive electrically conductive columnar members (preferably implemented as connector pins 13a and 13b) that extend through the copper foil pattern and the insulating layer 23. FIG. 8D is a perspective view illustrating the connector pin 13a. As shown in FIG. 8D, the connector pin 13a preferably includes a disk portion 27 and a cylindrical portion 28 and is preferably made of copper, brass or any other suitable material. The configuration of the connector pin 13b is preferably similar to that of the connector pin 13a. The length of the connector pins 13a and 13b is preferably defined such that the connector pins 13a and 13b do not extend through the metal base 22. This is because when neither of the connector pins 13a and 13b extends through the lower surface of the metal base 22, the metal base 22 has a flat lower surface and can make a thermal contact with a heat sink more easily. However, if the surface of the heat sink is provided with recesses to receive the connector pins 13a and 13b, then the connector pins 13a and 13b may protrude from the lower surface of the metal base 22. For example, if the metal base 22 has a thickness of about 2 mm to about 3 mm, then the length of the connector pins 13a and 13b may be defined such that the distance between the bottom of the connector pins 13a and 13b and the lower surface of the metal base 22 becomes about 1 mm. After a patterned conductive film has been defined on the insulating layer 23, the connector pins 13a and 13b are preferably press fitted into the metal base 22. The cylindrical portion of the connector pins 13a and 13b preferably has a diameter of, for example, about 1 mm to about 5 mm.

As shown in FIG. 8C, the power supply electrode 14 and the semiconductor chip electrode 26b are preferably electrically connected to the metal base 22 by way of the connector pins 13a and 13b, respectively. The FET device 19 is preferably soldered to the second conductive member 25 as also shown in FIG. 8C.

Next, referring to FIG. 8A, illustrated is a power supply electrode 14, connected to four connector pins 13a, on the left-hand side. For example, the negative power supply line of a DC power supply or battery (not shown) may be connected to this power supply electrode 14. Another power supply electrode 15, which may be connected to the positive power supply line of the DC power supply, for example, is preferably provided just on the right-hand side of that power supply electrode 14. This power supply electrode 15 preferably forms an integral part of the second conductive member 25 to which the FET devices 19 are connected.

The respective gate electrodes of the three FET devices 19, mounted on the second conductive member 25, are preferably electrically connected to a control circuit via bonding wires 20. The control circuit is preferably arranged around the power supply electrodes 14 and 15.

As shown in FIG. 8A, three output electrodes 16, 17 and 18 are preferably arranged on the right-hand side of the second conductive member 25. Three FET devices 19 are preferably provided on these output electrodes 16, 17 and 18, respectively. The respective gate electrodes of the FET devices 19 on the output electrodes 16, 17 and 18 are also preferably connected to a control circuit via bonding wires 20. The control circuit is preferably arranged around the right-hand edge of the substrate. These FET devices 19 are also preferably connected to the semiconductor chip electrodes 26a, 26b and 26c by way of other bonding wires 20. It should be noted that these bonding wires 20 are preferably made of a metal material such as aluminum.

In this manner, a circuit similar to the equivalent circuit shown in FIG. 2 is also implemented according to this preferred embodiment. In the conventional example illustrated in FIGS. 3A, 3B and 3C, two groups of conductive elements (e.g., copper foil patterns) are arranged over the substrate so as to supply a current from a DC power supply to the respective semiconductor chips. In this preferred embodiment, however, one of the two groups of conductive elements (e.g., copper foil patterns) is replaced with the metal base 22.

The motor driver of this preferred embodiment can convert a direct current, supplied from a battery or any other power supply (not shown), into an alternating current and can supply the alternating current to a three-phase AC motor (not shown) by way of the output electrodes 16, 17 and 18.

In this preferred embodiment, the metal base 22 functioning as the first conductive member is connected to a power supply (not shown) by way of the connector pin 13a and the power supply electrode 14 and acts as a negative power supply line. On the other hand, the second conductive member 25 is also connected to the power supply and acts as a positive power supply line.

The direction of the current flowing through the metal base 22 is opposite to that of the current flowing through the second conductive member 25. Thus, the parasitic inductance can be reduced. In addition, since only the very thin insulating layer 23 is interposed between the metal base 22 and the second conductive member 25, the inductance can be reduced significantly.

In the conventional motor driver, each bonding wire has a length of about 15 mm. However, in the motor driver of this preferred embodiment, the length of the bonding wires 20 can be decreased to about 5 mm to about 7 mm. This is because the respective circuit components can be arranged with much more design freedom and flexibility because of the arrangement of the metal base 22 and the second conductive member 25. That is to say, in this preferred embodiment, the metal base 22 and the second conductive member 25 are not arranged side by side on the same layer but belong to two mutually different layers. Also, when the bonding wires 20 are shortened in this manner, the inductance produced by the bonding wires 20 themselves can be reduced. In addition, the line inductance can also be reduced. As a result, the overall inductance of the motor driver can be reduced significantly.

Figure 3A:
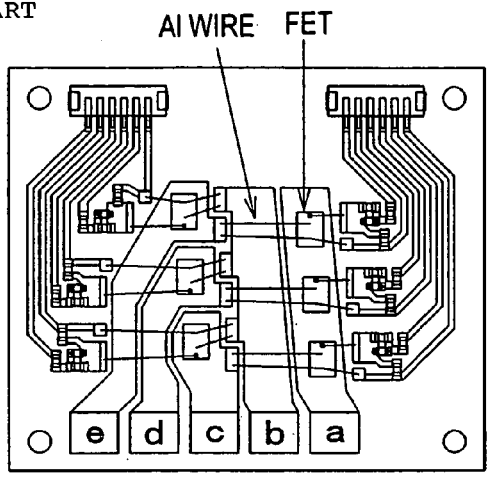
FIG. 3A is a plan view of a conventional motor driver in which the circuit shown in FIG. 2 is implemented by using the power module shown in FIG. 1.
Figure 3B:
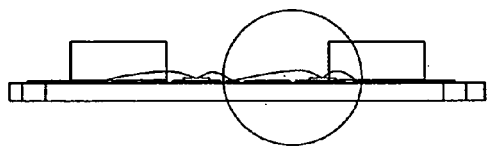
FIG. 3B is a cross-sectional view of a conventional motor driver in which the circuit shown in FIG. 2 is implemented by using the power module shown in FIG. 1.
Figure 3C:
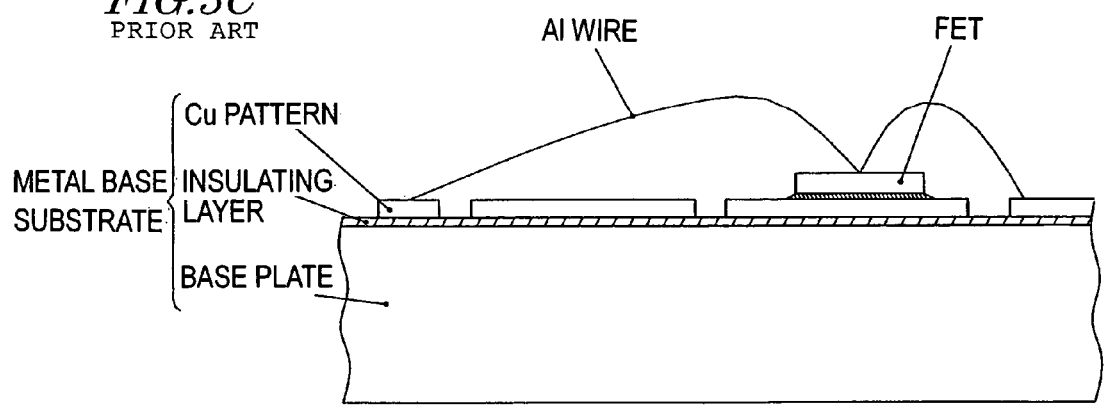
FIG. 3C illustrates the encircled portion of FIG. 3B on a larger scale.
Figure 4:
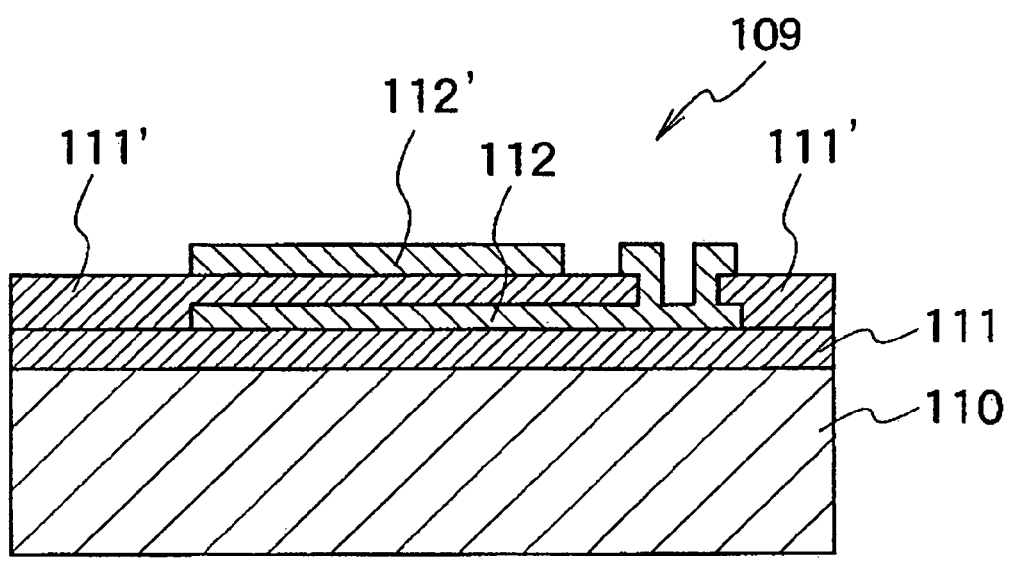
FIG. 4 is a cross-sectional view of a conventional electronic substrate with a two-layer interconnect structure.

The conventional motor driver shown in FIG. 3A has a line inductance of about 50 nH to about 100 nH. In contrast, the motor driver of this preferred embodiment has a much lower line inductance of about 10 nH to about 20 nH.

Accordingly, the overvoltage to be generated due to the inductance that is produced while the respective FET devices 19 are switching can be minimized and the respective FET devices 19 are hardly damaged. In addition, the ratings of the respective FET devices 19 and the number of additional components provided for the purpose of overvoltage protection can be reduced, and therefore the overall cost can be significantly reduced. Furthermore, the insulating layer 23 is preferably made of a material with high heat dissipation property and the metal base 22 with good thermal conductivity can quickly dissipate the heat of the FET devices 19 into the heat sink. Thus, the unwanted performance deterioration or the damage of the FET devices 19 due to the intense heat is avoidable. As a result, the reliability of the motor driver 1 can be increased significantly.

The polarities of the first and second conductive members may be opposite to those defined for the preferred embodiment described above. That is to say, a positive power supply line may be connected to the power supply electrode 14 and a negative power supply line may be connected to the power supply electrode 15.

In the preferred embodiment described above, only one current supplying portion (i.e., the second conductive member) is provided on the surface of the substrate. Accordingly, the motor driver of this preferred embodiment has such a simple structure that is easily produced at a significantly reduced cost.

In particular, according to this preferred embodiment, any conventional metal base substrate including a metal base may be used for heat dissipation purposes and that metal base may be used as the first conductive member. As a result, the manufacturing cost can be further reduced.

Preferred Embodiment 3

In the first and second preferred embodiments described above, the conductive base (metal plate) of the electronic substrate is used not only as a thermally conductive member but also as an electrically conductive member to be connected to an external power supply. In contrast, in the following third specific preferred embodiment of the present invention, a metal plate stacked on the electronic substrate is preferably used as an electrically conductive member to be connected to an external power supply.

Hereinafter, a motor driver 1 according to the third preferred embodiment of the present invention will be described with reference to FIGS. 9A, 9B and 9C.

Figure 9A:
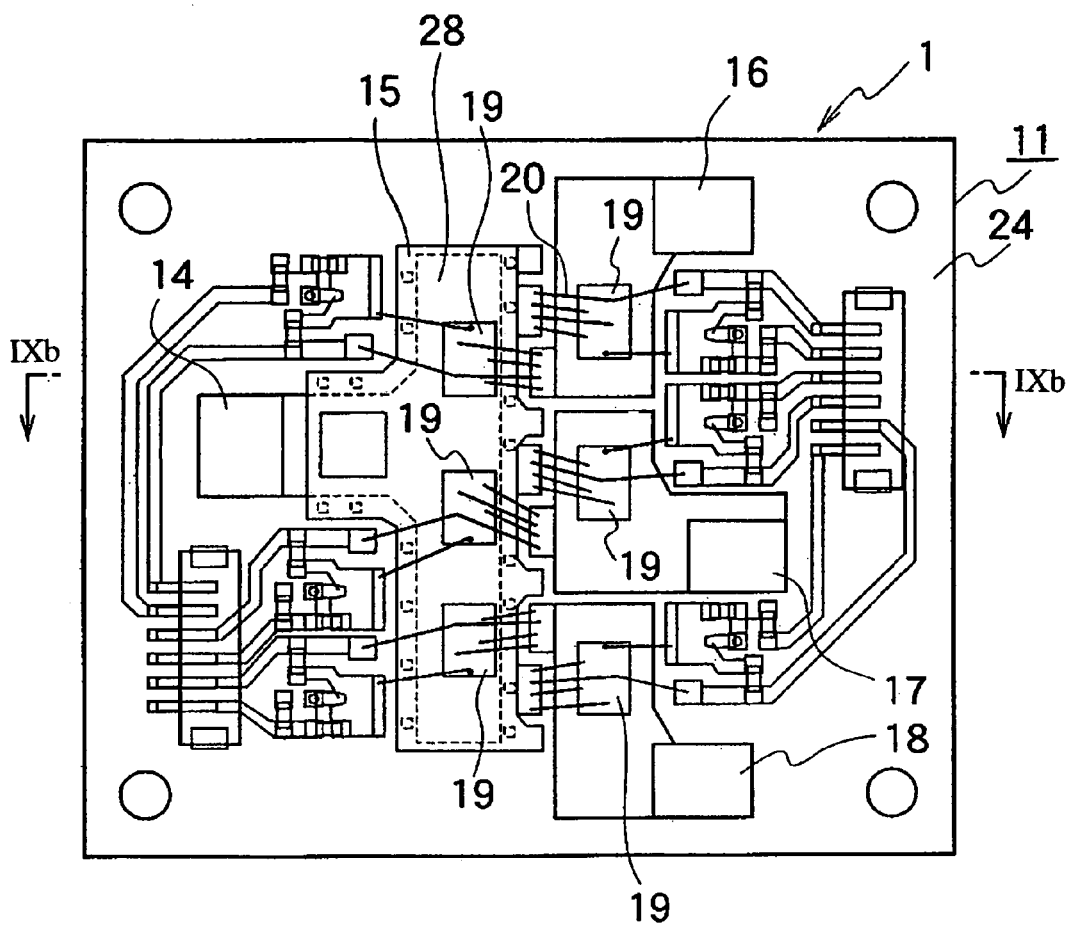
FIG. 9A is a plan view of a motor driver according to a third specific preferred embodiment of the present invention.
Figure 9B:
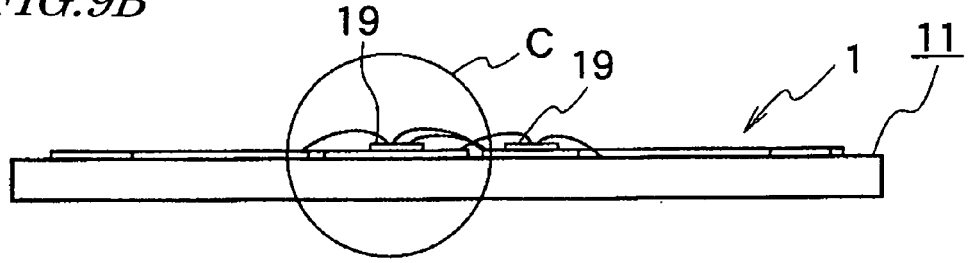
FIG. 9B is a cross-sectional view of FIG. 9A as taken along the lines IXb—IXb shown in FIG. 9A.

FIG. 9A is a plan view of a motor driver 1 according to the third preferred embodiment. FIG. 9B is a cross-sectional view thereof as taken along the lines IXb—IXb shown in FIG. 9A. FIG. 9C shows the encircled portion C of FIG. 9B on a larger scale.

Figure 9C:
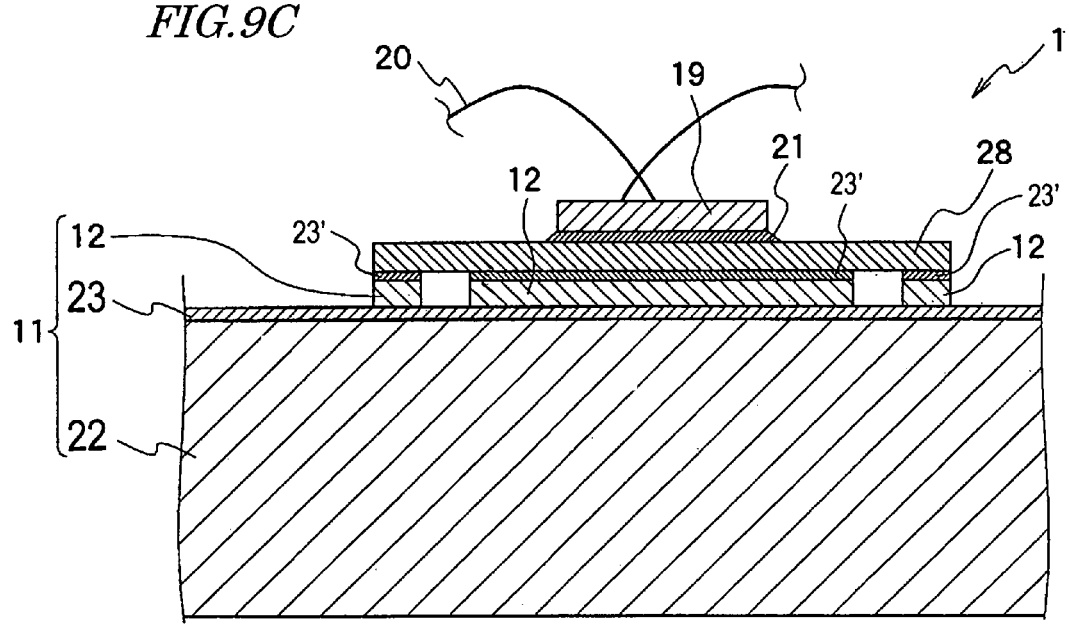
FIG. 9C shows the encircled portion C of FIG. 9B on a larger scale.

As shown in FIG. 9C, the motor driver 1 of this preferred embodiment preferably includes an electronic substrate 11 and FET devices 19 that are mounted on the electronic substrate 11. The electronic substrate 11 preferably includes a metal base 22 with a thickness of, for example, about 2 mm to about 3 mm, an insulating layer 23 provided on the metal base 22, and a plurality of conductive elements (e.g., copper foil pattern elements) 12 defined on the insulating layer 23. The electronic substrate 11 preferably has a substantially rectangular or substantially square planar shape with a length of about 30 mm to about 150 mm on each side. The copper foil pattern elements 12 preferably function as the power supply electrode 14 and output electrodes 16, 17 and 18 shown in FIG. 9A. For that reason, the copper foil pattern elements are not identified by the reference numeral 12 in FIG. 9A.

The metal base 22 is preferably a plate-shaped base made of an electrically conductive material with good thermal conductivity (e.g., aluminum or copper or other suitable material) and preferably has a thickness of, for example, at least 1 mm, more preferably about 2 mm to about 3 mm. The insulating layer 23 is preferably made of a material with good electrically insulating property and good heat dissipation property. In this preferred embodiment, the insulating layer 23 is preferably made of an epoxy resin with a thickness of, for example, about 0.2 mm or less (specifically, about 0.05 mm to about 0.2 mm).

As shown in FIG. 9C, a copper plate 28 is preferably provided over the copper foil pattern 12 with another insulating layer 23' interposed between them. The FET device 19 is preferably directly soldered to the copper plate 28. In FIG. 9C, the solder is identified by the reference numeral 21.

As shown in FIG. 9A, most of the underlying power supply electrode 14 is preferably covered with the copper plate 28. In FIG. 9A, the dashed line represents the configuration of the underlying power supply electrode 14 that is covered with the copper plate 28. The remaining portion of the underlying power supply electrode 14, which is not covered with the copper plate 28, is preferably connected to a power supply line of an external battery. As shown in FIG. 9A, three FET devices 19 are preferably mounted on the copper plate 28 and a portion of the copper plate 28 is preferably used as the second power supply electrode. A portion of the copper foil pattern 12 and the copper plate 28 may be electrically connected together by way of bonding wires. Alternatively, at least a portion of the insulating layer 23' between the lower-level copper foil pattern 12 and the upper-level copper plate 28 may be replaced with a conductive layer.

The insulating layer 23' for electrically isolating the copper plate 28 from the lower-level copper foil pattern 12 is preferably made of at least one material that is selected from the group consisting of a silicone sheet, a polyimide film and an epoxy resin, each of which has good electrically insulating property and good heat dissipation property. Alternatively, air gaps may also be provided instead of the layer or sheet of such an insulator. In that case, the air layer will function as the insulating layer 23. In any case, the insulating layer 23 preferably has a thickness of, for example, about 0.1 mm or less.

In this preferred embodiment, portions of the copper foil pattern 12, which extend toward the power supply electrode 14 and output electrodes 16, 17 and 18, function as the first conductive member and the copper plate 28 that covers this first conductive member functions as the second conductive member.

In various preferred embodiments of the present invention, the lower one of the two-layer conductive members to be connected to a power supply is referred to herein as a "first conductive member" and the upper one is referred to herein as a "second conductive member". In the second preferred embodiment described above, the first conductive member is preferably a metal plate. In this third preferred embodiment, however, the second conductive member is preferably a metal plate.

The configuration and arrangement of the output electrodes 16, 17 and 18 are substantially the same as the preferred embodiment shown in FIG. 8A. The following is the only difference between them. Specifically, in the preferred embodiment shown in FIG. 8A, the FET devices on the output electrodes 16, 17 and 18 are electrically connected to the metal base 22 by way of the semiconductor chip electrodes 26a, 26b and 26c. In this third preferred embodiment, however, the FET devices on the output electrodes 16, 17 and 18 are connected to the copper foil pattern 12 that is combined with the power supply electrode 14.

According to this preferred embodiment, substantially the same planar layout as that shown in FIG. 8A is realized. Thus, the bonding wires can also be shortened and the parasitic inductance can also be reduced as in the second preferred embodiment described above. In addition, the insulating layer 23 is preferably made of a material with good heat dissipation property and preferably has a very small thickness. Accordingly, the unwanted performance deterioration or damage of the FET devices 19 due to the intense heat is avoidable.

The second and third preferred embodiments of the present invention described above relate to a motor driver for supplying current to a three-phase AC motor. However, in another preferred embodiment of the present invention, the power module may also be applicable to any other purpose. For example, the power module may also be applicable for use in a device including a current amplifying semiconductor chip, a device for converting a direct current into an RF current, or a device for supplying current to a two-phase AC motor, or any other suitable device.

Also, even if the present invention is applied to a driver for a three-phase AC motor as in the preferred embodiments described above, the type and number of semiconductor chips to be mounted on the electronic substrate are not limited to those exemplified for the preferred embodiments described above.

Preferred Embodiment 4

Hereinafter, an electric vehicle according to a fourth specific preferred embodiment of the present invention will be described.

Figure 10:
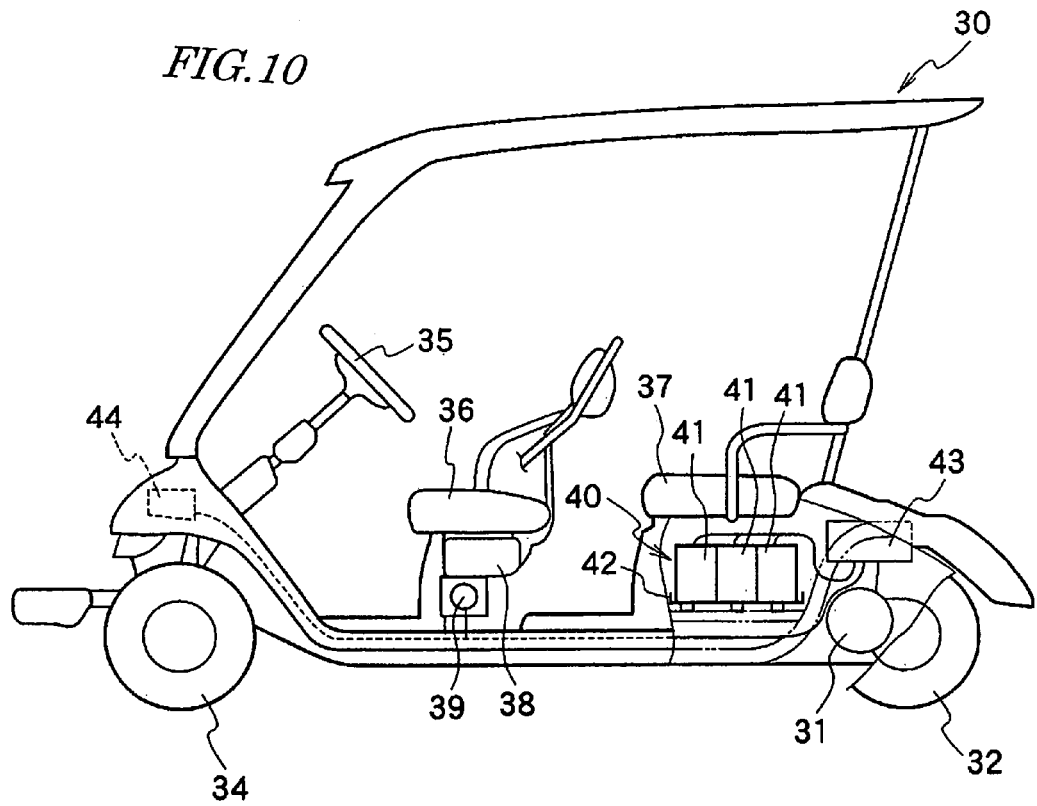
FIG. 10 is a side view of an electric vehicle according to a fourth specific preferred embodiment of the present invention.

FIG. 10 shows an electric vehicle 30 according to the fourth preferred embodiment. This electric vehicle 30 is preferably implemented as a golf cart which can be used effectively to carry baggage such as golf bags and players at a golf course, for example.

The electric vehicle 30 of this preferred embodiment preferably includes a traveling drive motor 31, two rear wheels 32 to be driven by the motor 31, and two manually or automatically steered front wheels 34. The drive force of the traveling drive motor 31 is transmitted to the rear wheels 32 by way of a transmission (not shown). The front wheels 34 are steered either by turning a steering wheel 35 manually or by an automatic driving control.

A front seat 36 and a rear seat 37 are preferably respectively provided at the front and rear portions of the vehicle 30. A charging controller 38 and a braking motor 39 are preferably provided under the front seat 36. A traveling drive battery system 40 is preferably provided as a power supply for the traveling drive motor 31 under the rear seat 37. The traveling drive battery system 40 preferably includes six batteries 41 that are connected in series together (only three of which are shown in FIG. 10). These batteries 41 are mounted on a receiving member 42 with some gaps provided between them.

A traveling controller 43 is preferably provided over the traveling drive motor 31. The traveling controller 43 is connected to the traveling drive battery system 40, traveling drive motor 31, braking motor 39 and steering motor 44 so as to control these members. The traveling controller 43 and the traveling drive motor 31 are preferably provided between the two rear wheels 32.

A motor driver according to a preferred embodiment of the present invention is preferably provided inside of the traveling controller 43, is supplied with a direct current from the battery system 40 and converts the direct current into an alternating current. The alternating current is supplied from the motor driver to the traveling drive motor 31, braking motor 39 and steering motor 44.

According to this preferred embodiment, an electric vehicle is equipped with a highly reliable motor driver. As a result, the electric vehicle can increase its reliability.

Various preferred embodiments of the present invention described above are effectively applicable for use in an electronic substrate on which power semiconductor chips are mounted so as to be supplied with a huge amount of current. Such an electronic substrate can be used effectively in a power module or a motor driver for an electric vehicle, for example.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2002-378553 and No. 2002-378579 filed on Dec. 26, 2002, the entire contents of which are hereby incorporated by reference.

What is claimed is:

1. An electronic substrate to mount a plurality of semiconductor chips thereon, the substrate comprising:
   a first conductive member, which is electrically connected to one of the semiconductor chips;
   a second conductive member, which is electrically connected to another one of the semiconductor chips; and
   an insulating layer for electrically isolating the second conductive member from the first conductive member; wherein
   the first conductive member is a conductive base that supports the insulating layer, the semiconductor chips and the second conductive member thereon;
   a connector extends through the insulating layer; and
   a first power supply electrode is provided on the insulating layer and is electrically connected to the conductive base by said connector.

2. The electronic substrate of claim 1, wherein the insulating layer is provided on the conductive base, a patterned conductive film is defined on the insulating layer, and a portion of the patterned conductive film functions as the second conductive member.

3. The electronic substrate of claim 2, further comprising:
   a first power supply electrode, which is electrically connected to the conductive base; and
   a second power supply electrode, which is electrically connected to the second conductive member; wherein
   while the semiconductor chips are ON, the first and second power supply electrodes are connected to an external power supply.

4. The electronic substrate of claim 3, wherein the first power supply electrode is provided on the insulating layer and is electrically connected to the conductive base by way of an opening which is arranged so as to extend through the insulating layer.

5. The electronic substrate of claim 4, wherein the conductive base is provided with a plurality of recesses, a first conductive pin is inserted into one of the recesses of the conductive base so as to electrically connect the conductive base to the first power supply electrode, and a second conductive pin is inserted into another one of the recesses of the conductive base so as to electrically connect the conductive base to another portion of the patterned conductive film.

6. The electronic substrate of claim 5, wherein the direction of a current flowing through an inside portion of the conductive base between the first and second conductive pins is substantially opposite to that of a current flowing through an inside portion of the second conductive member, the inside portion of the second conductive member overlapping with that of the conductive base.

7. The electronic substrate of claim 1, wherein the conductive base is a metal plate with a thickness of at least about 1 mm, and the conductive base has a flat back surface that is capable of making a thermal contact with a heat sink.

8. The electronic substrate of claim 3, wherein the second conductive member and the first and second power supply electrodes are defined by patterned metal foil.

9. The electronic substrate of claim 4, wherein the second conductive member and the first and second power supply electrodes are defined by patterned metal foil.

10. The electronic substrate of claim 3, wherein while the semiconductor chips are ON, a current flowing between the first and second power supply electrodes has a maximum value of at least about 50 amperes.

11. The electronic substrate of claim 4, wherein while the semiconductor chips are ON, a current flowing between the first and second power supply electrodes has a maximum value of at least about 50 amperes.

12. The electronic substrate of claim 1, wherein the insulating layer is made of an epoxy resin with a thickness of about 0.2 mm or less.

13. A power module comprising:
- a plurality of power semiconductor chips;
- a first conductive member, which is electrically connected to one of the power semiconductor chips;
- a second conductive member, which is electrically connected to another one of the power semiconductor chips; and
- an insulating layer for electrically isolating the second conductive member from the first conductive member; wherein
- the first conductive member is a conductive base that supports the insulating layer, the power semiconductor chips and the second conductive member thereon;
- a connector extends through the insulating layer; and
- a first power supply electrode is provided on the insulating layer and is electrically connected to the conductive base by said connector.

14. An electronic substrate to mount a plurality of semiconductor chips thereon, the substrate comprising:
- a first conductive member, which is electrically connected to one of the semiconductor chips;
- a second conductive member, which is electrically connected to another one of the semiconductor chips;
- an insulating layer for electrically isolating the second conductive member from the first conductive member; and
- a conductive base that supports the first and second conductive members, the insulating layer and the semiconductor chips thereon; wherein
- the second conductive member is a conductive plate, which is large enough to mount at least one of the semiconductor chips thereon;
- the conductive plate is supported on the conductive base so as to cover at least a portion of the first conductive member; and
- the direction of a current flowing through the conductive plate is substantially opposite to that of a current flowing through the portion of the first conductive member under the conductive plate.

15. The electronic substrate of claim 14, wherein the insulating layer includes at least one of a silicone sheet, a polyimide film, an epoxy resin and an air layer.

* * * * *